US011498988B2

(12) United States Patent
Pietsch et al.

(10) Patent No.: US 11,498,988 B2
(45) Date of Patent: Nov. 15, 2022

(54) METHOD FOR THE PRODUCTION OF FUNCTIONALIZED PARTIALLY HYDROLYZED POLYVINYL ACETATE

(71) Applicants: Flint Group Germany GmbH, Stuttgart (DE); Kuraray Europe GmbH, Hattersheim am Main (DE)

(72) Inventors: Christian Pietsch, Offenburg (DE); Thomas Telser, Heidelberg-Wieblingen (DE); Caroline Hartmann, Karlsruhe (DE); Uwe Krauss, Gossersweiler-Stein (DE); Moritz C. Baier, Hofheim am Taunus (DE)

(73) Assignee: Flint Group Germany GmbH, Stuttgart (DE)

( * ) Notice: Subject to any disclaimer, the term of this patent is extended or adjusted under 35 U.S.C. 154(b) by 314 days.

(21) Appl. No.: 16/768,149

(22) PCT Filed: Nov. 29, 2018

(86) PCT No.: PCT/EP2018/082993
§ 371 (c)(1),
(2) Date: May 29, 2020

(87) PCT Pub. No.: WO2019/106082
PCT Pub. Date: Jun. 6, 2019

(65) Prior Publication Data
US 2020/0317836 A1   Oct. 8, 2020

(30) Foreign Application Priority Data
Nov. 29, 2017   (EP) .................... 17204389

(51) Int. Cl.
C08F 218/08 (2006.01)
C08F 8/12 (2006.01)
C08F 8/14 (2006.01)
C08F 216/06 (2006.01)
C08J 3/00 (2006.01)

(52) U.S. Cl.
CPC .............. *C08F 218/08* (2013.01); *C08F 8/12* (2013.01); *C08F 8/14* (2013.01); *C08F 216/06* (2013.01); *C08J 3/005* (2013.01); *C08J 2329/04* (2013.01); *C08J 2331/04* (2013.01)

(58) Field of Classification Search
CPC ........ C08F 218/08; C08F 8/12; C08F 216/06; C08F 8/14; C08J 2329/04; C08J 2331/04; C08J 3/005
USPC ....................................................... 524/563
See application file for complete search history.

(56) References Cited

U.S. PATENT DOCUMENTS

| 3,615,629 A | 10/1971 | Wilhelm |
| 4,355,093 A | 10/1982 | Hartmann et al. |
| 4,540,743 A | 9/1985 | Schulz et al. |
| 2009/0092765 A1 | 4/2009 | Kohnen et al. |

FOREIGN PATENT DOCUMENTS

| DE | 1522444 A1 | 7/1969 | |
| DE | 3015419 A1 | 10/1981 | |
| DE | 3322993 A1 | 1/1985 | |
| DE | 19925133 A1 | 12/2000 | |
| EP | 0059988 A1 | 9/1982 | |
| EP | 0079514 A2 | 5/1983 | |
| EP | 0224164 A2 | 6/1987 | |
| EP | 0377190 A2 | 7/1990 | |
| EP | 0670521 A1 | 9/1995 | |
| EP | 0849635 A1 | 6/1998 | |
| EP | 0856472 A2 | 8/1998 | |
| EP | 0962828 A1 | 12/1999 | |
| EP | 2006307 A1 | 12/2008 | |
| JP | 07-173219 A | 7/1995 | |
| WO | 96/18133 A1 | 6/1996 | |
| WO | 2006/097656 A1 | 9/2006 | |
| WO | WO-2006097656 A1 * | 9/2006 | ............ C08F 261/04 |

OTHER PUBLICATIONS

Translation of WO 2006/097656, Sep. 21, 2006. (Year: 2006).*
International Search Report and Written Opinion received for PCT Patent Application No. PCT/EP2018/082993, dated Mar. 4, 2019, 14 pages.

* cited by examiner

*Primary Examiner* — Hui H Chin
(74) *Attorney, Agent, or Firm* — Faegre Drinker Biddle & Reath LLP

(57) ABSTRACT

A method for the production of functionalized partially hydrolyzed polyvinyl acetate comprising vinyl alcohol, vinylacetate and functionalized vinyl alcohol units by reacting in a melt a partially hydrolyzed polyvinyl acetate as component A with a reactive compound carrying at least one ethylenically unsaturated group and at least one reactive group reactive with hydroxyl or acetate groups as component B, in the presence of at least one stabilizer as component C and in the presence of at least one catalyst selected from the group consisting of tertiary amines and nitrogen-containing heterocycles as component D, the method comprising the steps: feeding the components into a mixing device capable of heating, melting and mixing components A, B, C and D, heating, melting and mixing components A, B, C and D in the device to give a melt and reacting components A and B in the melt.

21 Claims, No Drawings

METHOD FOR THE PRODUCTION OF FUNCTIONALIZED PARTIALLY HYDROLYZED POLYVINYL ACETATE

CROSS-REFERENCE TO RELATED APPLICATIONS

This application is a national stage application (under 35 U.S.C. § 371) of PCT/EP2018/082993, filed Nov. 29, 2018, which claims benefit of European Application No. 17204389.5, filed Nov. 29, 2017, both of which are incorporated herein by reference in their entirety.

The present invention concerns a method for the production of partially hydrolyzed polyvinyl acetate using reactive extrusion, the polymers obtained therewith and compositions containing those.

The production of functionalized polyvinyl acetates is known and described in e.g. U.S. RE 2740, DE 3015419, EP 0079514, DE 3322993, EP 849635 and EP 962828. U.S. RE 2740 describes the production of a cross-linked hydrogel in water by esterification of polyvinyl alcohol with methacrylic acid anhydride in the presence of potassium sulfate and sodium thiosulfate. DE 3015419 describes the conversion of a partially hydrolyzed polyvinyl acetate which is suspended in methylene chloride with methacrylic acid anhydride over 3 h at 50° C. Subsequently the polymer must be separated by filtration and dried. From EP 0 079 514 a similar method is known in which the reaction is performed in acetone and at 60° C. Also in this case the produced polymer must be separated by filtration and dried. In DE 3322993 an improvement of the method is described by using tertiary amines (e.g. pyridine derivatives) in acetone as well as in toluene. Also here a filtration and drying is necessary. In EP 962 828 the method is modified in that mixtures of alkyl carbonates (e.g. ethylene carbonate, propylene carbonate) are used as solvent.

In WO 96/18133 a method is described, in which polyvinyl alcohol is reacted with unsaturated aldehydes or the corresponding acetates in aqueous solution.

A drawback of these methods is that organic solvents are used and have to be removed after the reaction was finished. In addition the starting polymers are not dissolved completely but merely swollen which leads to an inhomogeneous reaction which is more intense at the surface of the swollen particles than in the core. And these methods are performed batch wise whereas continuously working processes are preferred.

EP 670 521 discloses the conversion of polyvinyl alcohol with carboxylic acid anhydrides, especially intramolecular cyclic anhydrides, in the melt at ca. 210° C. whereby side chains with carboxyl groups are introduced. Therefor the obtained polymers must be purified in an additional precipitation step to remove water and organic solvents. In the following the functionalized polyvinyl alcohol is reacted with glycidyl methacrylate to obtain a polyvinyl alcohol with unsaturated double bonds. This process is tedious and expensive.

DE 19925133 describes the modification of partially hydrolyzed polyvinyl acetates by extrusion and the use of glycidyl acrylates. However, in a previous step plasticizers as ethylene glycols or alkyl carbonates are compounded into the polymer in order to soften it. A drawback of the method is that only certain plasticizers can be used because others negatively influence the reaction. In addition these plasticizers may have unwanted effects in certain applications. Plasticizers usually cannot cross-link and may be extracted which may lead to an increase of hardness of the product. The plasticizers may also be the reason that the materials are too soft for some applications.

JPH 07173219 describes the modification of partially hydrolyzed polyvinyl acetates with carboxylic acid anhydrides in the melt, however anhydrides comprising double bonds are excluded, most probably because of crosslinking during the reaction.

It is an object of the present innovation to provide a simple method for introducing ethylenically unsaturated groups into a partially hydrolyzed polyvinyl acetate without the use of solvents or plasticizers, which method provides the functionalized partially hydrolyzed polyvinyl acetate free of unwanted impurities and with a homogeneous distribution of the ethylenically unsaturated functional groups. The method should preferably work in a continuous mode and have less process steps.

The object is solved by a method for the production of functionalized partially hydrolyzed polyvinyl acetate comprising vinyl alcohol, vinyl acetate and functionalized vinyl alcohol units by reacting in a melt a partially hydrolyzed polyvinyl acetate as component A, a reactive compound carrying at least one ethylenically unsaturated group and at least one reactive group reactive with hydroxyl or acetate groups as component B, in the presence of at least one stabilizer as component C and optionally in the presence of a catalyst as component D, the method comprising the steps:
  a) optionally drying one or more of components A, B, C and optionally D,
  b) optionally pre-mixing at least two of components A, B, C and optionally D,
  c) feeding the components into a mixing device capable of heating, melting and mixing components A, B, C and optionally D,
  d) heating, melting and mixing components A, B, C and optionally D in the device to give a melt and reacting components A in B in the melt,
  e) optionally cooling or shaping and cooling the obtained mixture.

The partially hydrolyzed polyvinyl acetate used as component A comprises vinyl alcohol units, vinyl acetate units and functionalized vinyl alcohol units and may optionally comprise additional units which were incorporated during polymerization of the vinyl acetate and/or by reactions following the polymerization. Such other units can be present in an amount of 0.1 to 50 mol %, preferably 0.1 to 25 mol %, more preferably 0.1 to 15 mol % based on all monomer units of the partially hydrolyzed polyvinyl acetate. Such other units could stem from other compounds bearing a vinyl unit, e.g. from α-olefins, such as ethylene and propylene; (meth)acrylic acid and salts thereof; (meth)acrylic acid esters, such as methyl (meth)acrylate, ethyl (meth)acrylate, n-propyl (meth)acrylate, i-propyl (meth)acrylate, n-butyl (meth)acrylate, i-butyl (meth)acrylate, t-butyl (meth)acrylate, 2-ethylhexyl (meth)acrylate, dodecyl (meth)acrylate, and octadecyl (meth)acrylate; (meth)acrylamide; (meth)acrylamide derivatives, such as N-methyl (meth)acrylamide, N-ethyl (meth)acrylamide, N,N-dimethyl (meth)acrylamide, diacetone (meth)acrylamide, (meth)acrylamide propane sulfonic acid and salts thereof, (meth)acrylamidopropyl dimethylamine and salts thereof or quaternary salts, and N-methylol (meth)acrylamide and derivatives thereof; vinyl ethers, such as methyl vinyl ether, ethyl vinyl ether, n-propyl vinyl ether, i-propyl vinyl ether, n-butyl vinyl ether, i-butyl vinyl ether, t-butyl vinyl ether, dodecyl vinyl ether, and stearyl vinyl ether; nitriles, such as acrylonitrile and methacrylonitrile; vinyl halides, such as vinyl chloride and vinyl fluoride; vinylidene halides, such as vinylidene chloride and vinylidene fluoride; allyl compounds, such as allyl acetate, allyl alcohol, allyl, allyl chloride and 3,4-diacetoxy-1-butene, 3,4-dihydroxy-1-butene, 1,4-diacetoxy-1-butene and 1,4-dihydroxy-1-butene; unsaturated dicarboxylic acids, such as maleic acid, itaconic acid, and fumaric acid, and salts thereof or esters thereof; vinylsilyl compounds, such as vinyltrimethoxysilane; isopropenyl acetates; and the like. Preferred additional units are: a vinyl unit, e.g. from α-olefins, such as ethylene; (meth)acrylic acid and salts thereof; (meth)acrylic acid esters. The polymer structure of the vinyl acetate copolymer can be syndiotactic, isotactic, atactic, linear, cyclic, branched, grafted or dendritic or combinations thereof. It is possible to use statistic copolymers as well as alternating or block copolymers. The polymers may be insoluble, soluble in organic solvents or aqueous solutions or combinations thereof. Preferably the polymers are either soluble, dispersible or emulsifiable in water or aqueous solutions.

The degree of hydrolysis of the starting partially hydrolyzed polyvinyl acetate, i. e. before functionalization, is in general in the range of from 0.01 to 99.9 mol %, preferably in the range of from 50 to 99 mol %, more preferably in the range of from 60 to 95 mol %, most preferably in the range of from 70 to 90 mol %, based on all monomer units contained in the partially hydrolyzed polyvinyl acetate, including co-monomer units. In a further embodiment the viscosity (measured as 4 wt % solution in water) of the starting partially hydrolyzed polyvinyl acetate is in the range of from 0.1 to 50 mPa s, preferably in the range of from 1 to 30 Pa s, more preferably in the range of from 2 to 10 mPa s.

The reactive compound carrying at least one ethylenically unsaturated group used as component B carries at least one reactive group which is able to react with one or more of the OH- or OAc-groups of the partially hydrolyzed polyvinyl acetate.

Mixtures of two or more reactive compounds may also be used. It is also possible to use compounds that carry more than one reactive group and/or more than one carbon-carbon double bond. The reactive group of the reactive compound of component B is selected from a group consisting of an isocyanate group, an isothiocyanate group, an epoxy group, an aziridine group, a sulfonyl halide group, an acid halide group, a carboxylic anhydride group, a carboxylic acid group, a carboxylic ester group, an aldehyde group, a maleimide group, N-hydroxy-succinimide ester group or any combination thereof. Preferably the reactive group is a carboxylic acid anhydride group, a carboxylic acid group, a carboxylic acid ester group or an aldehyde group. The most preferred reactive groups are a carboxylic acid anhydride group and a carboxylic acid group. The ethylenic unsaturated group may be a substituted or unsubstituted carbon-carbon double bond which may form part of an aliphatic or heteroaliphatic ring. The substituents at the double bond may be aliphatic, heteroaliphatic or aromatic. Preferably the ethylenic unsaturated double bond is capable of undergoing radical polymerization and/or cationic polymerization and/or crosslinking reactions and/or further functionalization reactions. Preferably the ethylenically unsaturated group is present as a methacrylic group, an acrylic group, a vinyl ether group, a styrene group, an allyl ether group, a vinyl silane group, an acrylamide group, a methacryl amide group, an epoxy acrylate group or any combination thereof. In a preferred embodiment, the reactive compound B is a methacrylic or acrylic acid derivative. Preferably the reactive compound is a (meth)acrylic acid halogenide, a (meth)acrylic acid ester, a (meth)acrylic acid anhydride or a derivate prepared by using an activating reagent for the carboxylic acids (e.g. dicyclohexylcarbodiimide or 1-ethyl-3-(3-dimethylaminopropyl)carbodiimide) or the corresponding NHS-ester (N-hydroxysuccinimide) of meth-acrylic acid. Most preferred reactive compounds are (meth) acrylic acid, (meth)acrylic acid anhydride and glycidyl (meth)acrylate. Particularly preferred reactive compounds are methacrylic acid anhydride, acrylic acid anhydride and glycidyl (meth)acrylate. The reactive compound is covalent attached to the polymer via a linker and has at least one of the following structural units (Ia)-(Id). The reactive compound is covalently attached to the polymer via a linker. The linker unit has at least one of the following structural units: ester, thioester amid, ether, thioether, urethane, urea, thiourea.

The amount of the reactive compound in the reaction mixture is in the range of 0.1 to 30 wt %, preferably 0.5 to 20 wt %, more preferably 1 to 15 wt % and most preferably 1 to 13 wt %, based on the total weight of the reaction mixture containing components A, B, C and optionally D.

The stabilizer used as component C is a radical scavenging compound and also mixtures of such stabilizers may be employed. Examples for stabilizers are sterically hindered phenols, sterically hindered amines including N—H, N—R or N—OR type hindered amines, hydroquinones, phenothiazines, thiols and combinations thereof. Such compounds are listed e.g. in "Handbuch Kunststoff Additive", ed. Ralph-Dieter Maier, Michael Schiller, $4^{th}$ Edition, Carl Hanser Verlag München 2016. Preferably hindered phenols or thiols or sterically hindered amines like e.g. 2,6-di-tert-butyl-4-methylphenol (BHT), pentaerythritol tetrakis (3-(3,5-ditert-butyl 4-hydroxy phenyl) propionate), 2-tert-butyl-4-ethylphenol, 5-chloro-2-hydroxybenzophenone, 5-chloro-2-hydroxy-4-methylbenzophenone, 2,4-di-tert-butyl-6-(5-chloro-2H-benzotriazol-2-yl)phenol, 2,6-di-tert-butyl-4-(dimethylaminomethyl)phenol, 3',5'-dichloro-2'-hydroxyacetophenone, 2,4-dihydroxybenzophenone, 2,2'-dihydroxy-4-methoxybenzophenone, 2',4'-dihydroxy-3'-propylacetophenone, 2,2'-ethylidenebis(4,6-di-tert-butylphenol), 2-hydroxy-4-(octyloxy)benzophenone, 2,2'-methylenebis[6-(2H-benzotriazol-2-yl)-4-(1,1,3,3-tetramethylbutyl)phenol], 2,2'-methylenebis(6-tert-butyl-4-ethylphenol), 5,5'-methylenebis(2-hydroxy-4-methoxybenzophenone), octadecyl 3-(3,5-di-tert-butyl-4-hydroxyphenyl)propionate, pentaerythritol tetrakis(3,5-di-tert-butyl-4-hydroxyhydrocinnamate), 1,3,5-trimethyl-2,4,6-tris(3,5-di-tert-butyl-4-hydroxybenzyl)benzene, tris(4-tert-butyl-3-hydroxy-2,6-dimethylbenzyl) isocyanurate, 1,3,5-tris(2-hydroxyethyl)isocyanurate, menthyl anthranilate, octadecyl 3,5 di-tert-butyl-4-hydroxyhydrocinnamate, pentaerythritol tetrakis (3-(3,5-di-tert-butyl-4-hydroxyphenyl) propionate); oxtadecyl-3(3,5-di-tert.-butyl-4-hydroxyphenyl)propionate; ethylene bis(oxyethylene) bis-(3-(5-tert-butyl-4-hydroxy-mtolylpropionate, N,N'-hexane-1,6-diylbis (3-(3,5-di-tert-butyl-4-hydroxyphenylpropionamide), benzenepropopanoic acid, 3,5-bis(1,1-dimethylethyl)-4-hydroxy-C7-C9 branched alkyl esters, 2-(3-tert-butyl-2-hydroxy-5-methylphenyl)-5-chloro-2H-benzotriazole, 2-(2-hydroxy-3,5-diperyl-phenyl)benzotriazole, 1,3,5-trimethyl-2,4,6-tris(3,5-di-tertbutyl-4-hydroxybenzyl)benzene, N-(1-acetyl-2,2,6,6-tetramethyl-4-piperidinyl)-2-dodecylsuccinimide, derivatives of 2,2,6,6-tetramethylpiperidine, poly[[6-[(1,1,3,3-tetramethylbutyl) amino]-1,3,5-triazine-2,4-diyl][(2,2,6,6-tetramethyl-4-piperidinyl)imino]-1,6 hexanediyl[(2,2,6,6-tetramethyl-4-piperidinyl)imino]]), bis(2,2,6,6,-tetramethyl-4-piperidyl) sebaceate, bis(1,2,2,6,6-pentamethyl-4-piperidyl)sebacate, methyl 1,2,2,6,6-pentamethyl-4-piperidyl sebacate, bis(1,2,2,6,6-pentamethyl-4-piperidinyl)-2-butyl-2-(4-hydroxy-3,5-di-tert-butylbenzyl)propanedioate, 2-6-di-tert-butyl-4-methylphenol, alkylated bis-phenols, e.g., 2,2-methylene-bis-(4-methyl-6-tert-butylphenol); 2-(4-hydroxy-3,5-di-tert-butylanilino)-4,6-bis-(n-octyl thio)-1,3,5-triazine, dilauryl thiopropionate, didodecyl 3,3'-thiodipropionate, 4-allyloxy-2-hydroxybenzophenone, 2-(2H-benzotriazol-2-yl)-4,6-bis(1-methyl-1-phenylethyl)phenol, 2-tert-butyl-6-(5-chloro-2H-benzotriazol-2-yl)-4-methylphenol, 2-(2H-benzotriazol-2-yl)-4,6-di-tert-pentylphenol, 2-(2H-benzotriazol-2-yl)-6-dodecyl-4-methylphenol, 2-[3-(2H-benzotriazol-2-yl)-4-hydroxyphenyl]ethyl methacrylate, 2-(2H-benzotriazol-2-yl)-4-methyl-6-(2-propenyl)phenol, 2-(2H-benzotriazol-2-yl)-4-(1,1,3,3-tetramethylbutyl)phenol, 2-(4-Benzoyl-3-hydroxyphenoxy)ethyl acrylate, 3,9-bis(2,4-dicumylphenoxy)-2,4,8,10-tetraoxa-3,9-diphosphaspiro[5.5]undecane, bis(1-octyloxy-2,2,6,6-tetramethyl-4-piperidyl) sebacate, bis(2,2,6,6-tetramethyl-4-piperidyl) sebacate, 2-(4,6-diphenyl-1,3,5-triazin-2-yl)-5-[(hexyl)oxy]-phenol, 5-ethyl-1-aza-3,7-dioxabicyclo[3.3.0]octane, ethyl 2-cyano-3,3-diphenylacrylate, 2-ethylhexyl 2-cyano-3,3-diphenylacrylate, 2-ethylhexyl salicylate or phenothiazineare used. Within the hydroquinones e.g. monomethylether hydroquinone (MEHQ), trimethyldihydroquinone, polymerized trimethyldihydroquinone, 2,3-dimethylhydroquinone, 2-methoxyhydroquinone, methyl-p-benzoquinone, methylhydroquinone, tetrachloro-1,4-benzoquinone are preferred. Particularly preferred stabilizers are BHT and MEHQ. The amount of stabilizer in the reaction mixture is in the range of 0.01 to 5 wt %, preferably in the range of 0.05 to 4 wt %, more preferably 0.05 to 3 wt % and most preferably 0.05 to 2 wt % based on the total weight of the reaction mixture containing components A, B, C and optionally D.

In addition to a stabilizer also a catalyst or a mixture of different catalysts may be used as component D and in most cases an amine or an N containing heterocycle will be added as component D. The amine may be a primary, secondary or tertiary amine. Preferably the amine is a tertiary amine. The amine may be an aromatic or aliphatic amine or a heterocyclic amine. Examples for the amines and N containing heterocycles to be used in the process may be pyridines and piperidines. Examples for amines and N containing heterocycles preferably used in the process are N-methylimidazole, pyridine, 2-methylimidazole, dimethylaminopyridine, triethylamine, 1,8-diazabicyclo[5.4.0]undec-7-ene, diaminobicyclooctane, p-dimethylaminopyridine, p-pyrrolidinopyridine, N,N-benzyldimethylamine, N-ethylmorpholine, 1-(2-hydroxypropyl)imidazole, 2-hydroxyethylpiperazine, 1,4-di-(2-hydroxyethyl)piperazine, N,N-dimethylcyclohexylamine, tris[3-(dimethylamino)propyl]-hexahyro-s-trizine. Preferably the following catalysts are used: N-methylimidazole, pyridine, 2-methylimidazole, dimethylamino pyridine, triethyl amine, 1,8-diazabicyclo[5.4.0]undec-7-ene, p-dimethylaminopyridine and p-pyrrolidinopyridine. In a particularly preferred embodiment, N-methylimidazole is used, which is both a tertiary amine and an N containing heterocycle. Also combinations of different catalysts may be used. The amount of catalyst in the reaction mixture is in the range of 0.01 to 5 wt %, preferably in the range of 0.05 to 4 wt %, more preferably 0.05 to 3 wt % and most preferably 0.05 to 2 wt % based on the total weight of the reaction mixture.

The functionalized partially hydrolyzed polyvinyl acetate comprises as functionalized vinyl alcohol units in particular one or more units selected from the following units (Ia)-(Id):

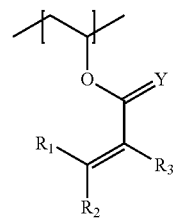

Ia

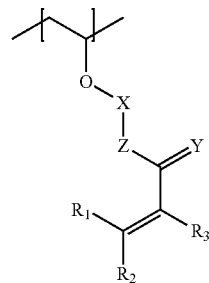

Ib

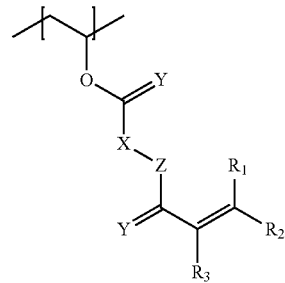

Ic

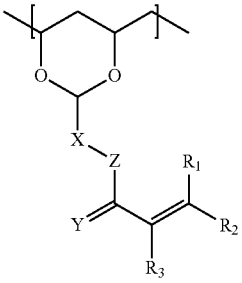

Id wherein R1, R2 and R3 are independently hydrogen, a linear or branched aliphatic or heteroaliphatic group having 1 to 12 carbon atoms or a cycloaliphatic, heterocyclic or aromatic group having 3 to 12 carbon atoms, and wherein X is a linear or branched or cyclic aliphatic or heteroaliphatic group having 1 to 12 carbon atoms or a cycloaliphatic, heterocyclic or aromatic group having 3 to 12 carbon atoms, Y is O or S and Z is N—R4, S or O with R4 being hydrogen, a linear or branched aliphatic or heteroaliphatic group having 1 to 12 carbon atoms or a cycloaliphatic, heterocyclic or aromatic group having 3 to 12 carbon atoms.

In another embodiment R1 and R2 are hydrogen and R3 is hydrogen, a linear or branched aliphatic or heteroaliphatic group having 1 to 12 carbon atoms or a cycloaliphatic, heterocyclic or aromatic group having 3 to 12 carbon atoms, and wherein X is a linear or branched or cyclic aliphatic or heteroaliphatic group having 1 to 12 carbon atoms or a cycloaliphatic, heterocyclic or aromatic group having 3 to 12 carbon atoms, Y is O or S and Z is N—R4, S or O with R4 being hydrogen, a linear or branched aliphatic or heteroaliphatic group with 1 to 12 carbon atoms or a cycloaliphatic, heterocyclic or aromatic group having 3 to 12 carbon atoms. Preferably R1 and R2 is hydrogen and R3 is a linear aliphatic group having 1 to 6 carbon atoms. More preferably R1 and R2 is hydrogen and R3 is methyl or ethyl. Preferably X is O.

In addition to vinyl alcohol units, vinyl acetate units and functionalized units the functionalized polyvinyl acetate products obtained by the method of the invention may optionally comprise additional units which were incorporated during polymerization of the vinyl acetate and/or by reactions following the polymerization. Such other units could stem from other compounds bearing a vinyl unit, e.g. from α-olefins, such as ethylene and propylene; (meth) acrylic acid and salts thereof; (meth)acrylic acid esters, such as methyl (meth)acrylate, ethyl (meth)acrylate, n-propyl (meth)acrylate, i-propyl (meth)acrylate, n-butyl (meth)acrylate, i-butyl (meth)acrylate, t-butyl (meth)acrylate, 2-ethylhexyl (meth)acrylate, dodecyl (meth)acrylate, and octadecyl (meth)acrylate; (meth)acrylamide; (meth)acrylamide derivatives, such as N-methyl (meth)acrylamide, N-ethyl (meth)acrylamide, N,N-dimethyl (meth)acrylamide, diacetone (meth)acrylamide, (meth)acrylamide propane sulfonic acid and salts thereof, (meth)acrylamidopropyl dimethylamine and salts thereof or quaternary salts, and N-methylol (meth)acrylamide and derivatives thereof; vinyl ethers, such as methyl vinyl ether, ethyl vinyl ether, n-propyl vinyl ether, i-propyl vinyl ether, n-butyl vinyl ether, i-butyl vinyl ether, t-butyl vinyl ether, dodecyl vinyl ether, and stearyl vinyl ether; nitriles, such as acrylonitrile and methacrylonitrile; vinyl halides, such as vinyl chloride and vinyl fluoride; vinylidene halides, such as vinylidene chloride and vinylidene fluoride; allyl compounds, such as allyl acetate, allyl alcohol, allyl, allyl chloride and 3,4-diacetoxy-1-butene, 3,4-dihydroxy-1-butene, 1,4-diacetoxy-1-butene and 1,4-dihydroxy-1-butene; unsaturated dicarboxylic acids, such as maleic acid, itaconic acid, and fumaric acid, and salts thereof or esters thereof; vinylsilyl compounds, such as vinyltrimethoxysilane; isopropenyl acetates; and the like. Naturally the functionalized partially hydrolyzed polyvinyl acetates possess the general structure of the starting polymer. The structure of the functionalized polyvinyl acetate products can be syndiotactic, isotactic, atactic, linear, cyclic, branched, grafted or dendritic or combinations thereof. It is possible to obtain statistic copolymers as well as alternating or block copolymer. The functionalized polyvinyl acetate products may be insoluble, soluble in organic solvents or aqueous solutions or combinations thereof. Preferably the functionalized polyvinyl acetate products are either soluble, dispersible or emulsifiable in water or aqueous solutions.

In another embodiment the degree of functionalization of the functionalized polyvinyl acetate products is in the range of 0.01 to 99.9 mol %, preferably in the range of 0.1 to 30 mol %, more preferably in the range of 0.5 to 20 mol %, most preferably in the range of 0.5 to10 mol % and in specific cases in the range of 0.5 to 5 mol %, based on all monomer units of the functionalized partially hydrolyzed polyvinyl acetate.

In another embodiment the degree of hydrolysis of the partially hydrolyzed polyvinyl acetate after functionalization is in the range of 0.01 to 99.8 mol %, preferably in the range of 50 to 99 mol %, more preferably in the range of 60 to 95 mol %, most preferably in the range of 70 to 90 mol %, based on all monomer units contained in the functionalized partially hydrolyzed polyvinyl acetate.

In a further embodiment the viscosity (measured as 4 wt % solution in water) of the functionalized polyvinyl acetate polymer is in the range of 0.1 to 50 mPa s, preferably in the range of 1 to 30 mPa s, more preferably in the range of 2 to 10 mPa s.

Steps a) and b) are optional. In some cases it can be advantageous to dry the starting materials and remove water or residual solvent in order to avoid unwanted reactions and/or formation of bubbles. For drying all procedures known to a person skilled in the art may be used. The drying procedures may be selected from the group consisting of heating, vacuum treatment, treatment with water scavengers, spray drying, freeze drying and any combinations thereof.

It may also be advantageous to pre-mix two or more starting materials in order to increase homogeneity. For mixing all methods known to a person skilled in the art may be used. The mixing procedures may be selected from the group of dry mixing, co-precipitation, melt mixing, solution mixing, spray coating of a component onto particles of another component, spray coating of a solution of one or more components onto particles of another component followed by optionally removal of the solvent and combinations thereof. Mixing by incorporation of a liquid into a solid or of solid in a liquid may be advantageous and reduces the number of inlets at the device capable of heating and mixing. In one embodiment the feeding of the components is performed in a way that a pre-mixture of all components or of some of the components followed by the others is used.

In step c) a mixing device capable of heating and mixing the components A, B, C and optionally D and forming a melt is provided and the starting materials are fed into the device using at least one feeding entrance. According to the invention, use may be made of any of the processes known to the person skilled in the art for thermoplastic processing. Correspondingly, use may also be made of any of the equipment known to the person skilled in the art and suitable for this purpose. However, preference is given to melt extrusion and therefore to the use of melt extruders.

In one embodiment the device capable of heating and mixing the components and forming a melt is selected from the group consisting of a kneader, a (Buss) co-kneader, a single screw extruder, a co- or counter-rotating twin-screw extruder and a multi screw extruder. The selection of suitable extruder screws, the geometries of which have to be matched to the expected processing functions, e.g. intake, conveying, homogenizing, melting, and compressing, is within the general knowledge of the person skilled in the art.

In some embodiments the extruder has a length to diameter ratio in the range of 20 to 150, preferably 40 to 110, more preferably 42 to 60. In general the extruder comprises at least a transport element, and optional other elements selected from the group consisting of a mixing element, a kneading element, a back pumping element, a barrier element, a degassing element, a cooling element and any combination thereof. Some elements may also combine different functions e.g. degassing and mixing. The position of the different elements along the extruder is governed for example by the temperature profile or the feeding sequence or combinations thereof. Preferably the following setup is used:

The feeding of the components can be carried out in a way that a pre-mixture of all components is fed or a pre-mixture of some of the components is fed first, followed by the other components.

In preferred embodiments the feeding of the components is performed sequentially with the polyvinyl acetate fed first. Some of the preferred sequences of feeding the components (in the order as indicated in brackets) are as follows:

a. (1) polyvinyl acetate, followed by (2) stabilizer, then (3) catalyst and then (4) reactive compound;
b. (1) polyvinyl acetate mixed with catalyst, followed by (2) stabilizer and (3) reactive compound;
c. (1) polyvinyl acetate mixed with catalyst and stabilizer and reactive compound;
d. (1) polyvinyl acetate and stabilizer fed synchronically followed by (2) catalyst and (3) reactive compound;
e. (1) polyvinyl acetate mixed with stabilizer and followed by (2) catalyst and (3) reactive compound;
f. (1) polyvinyl acetate mixed with part of the stabilizer followed by (2) catalyst and (3) reactive compound mixed with part of the stabilizer;
g. (1) polyvinyl acetate followed by (2) catalyst and (3) reactive compound mixed with stabilizer;
h. (1) polyvinyl acetate followed by (2) polyvinyl acetate mixed with stabilizer and (3) catalyst followed by (4) reactive compound;
i. (1) polyvinyl acetate followed by (2) catalyst mixed with stabilizer and (3) reactive compound;
j. (1) polyvinyl acetate mixed with stabilizer and catalyst followed by (2) reactive compound; or
k. (1) polyvinyl acetate and stabilizer followed by (2) polyvinyl acetate mixed with catalyst followed by (3) reactive compound.

Preferably sequence d., e., f., g. or j., most preferably sequence d. or e. from above are used. It is advantageous to distribute the stabilizer homogeneously within the polyvinyl acetate in order to have protection before any reactive compound is added. It is preferred to have the catalyst homogeneously distributed before the reactive compound is added to obtain a homogeneous functionalization. High concentrations would be produced locally when the catalyst would be added after the reactive compound which is unfavorable for a homogeneous reaction. In case of e. the synchronous addition of polyvinyl acetate and stabilizer saves the additional mixing step as described in d.

Feeding of the components may be performed in different segments of the device depending on the nature of the components and the sequence of addition. The position of the feeding elements may also depend on the temperature which is reached at certain positions of the device. Liquid as well as solids may be fed using the proper feeding units.

For reactions where side products are generated, e.g. condensation reactions it is advantageous to eliminate those at least partially. The reactions used in the present invention are mostly condensation reactions and the condensates may be eliminated by degassing elements since at the temperatures used, most of the condensates e.g. water or (meth) acrylic acid are volatile.

During step c) the starting materials are mixed and heated in order to form a homogeneous melt and the temperature is raised from room temperature to temperatures where the polymers start to soften and/or flow. In step d) the temperature may be raised further to temperatures where the reaction of the reactive compound with the OH- and/or the OAc-groups of the partially hydrolyzed polyvinyl acetate starts. The temperature may be increased further in order to increase the speed of the reaction but has to stay below temperatures where degradation and/or unwanted side reactions occur. Also during step c) the temperature may reach a level where the intended reaction starts and then it is possible to shorten step d). Using catalysts the reaction temperature may be lowered, speed of reaction may be increased and helps to suppress unwanted side reactions. The temperatures of the different zones of the extruder cylinder are selected to be in the range of 0° C. to 270° C., preferably in the range of 10° C. to 260° C., more preferably in the range of 15° C. to 250° C. most preferably in the range of 15° C. to 230° C. Typically the feeding section of the extruder is cooled to 10 to 25° C. and the temperature is gradually increased to the extruder temperature of 70 to 270° C., preferably in the range of 100° C. to 240° C., more preferably in the range of 160° C. to 230° C., most preferably in the range of 180° C. to 210° C. over a distance of 2 D-20 D and kept there until the end of the extruder. Optionally the temperature is gradually decreased at the end of the extruder to lower the melt temperature before the melt exits the extruder. The extruder die temperature is adjusted according to common knowledge to assure smooth extrusion of the melt.

When the reaction has come to an end the mixture may be actively cooled in an optional cooling step e). This can be advantageous e.g. when the reaction shall be stopped or retarded at some stage or when the mixture needs to be packed into containers which are heat sensitive. Cooling may be performed with any method known to the person skilled in the art. Examples for cooling methods to be used are for example cooling with a cooling element attached to the extruder where water or other cooling liquids may be used to cool the element, cooling rolls, cooling belt or passing the extruded material through a liquid cooling bath e.g. filled with water or other liquid, or spraying a cooling liquid or blowing a gas, preferably air, onto the mixture or combinations thereof.

In some cases it may be advisable to perform a shaping step before the cooling step, whereby one or more strands or profiles, films, tapes, plates, tubes, rods, or pellets are formed. Formation of pellets may be done e.g. by cutting the extruded material directly at the extruder die or by cutting the formed profiles. For cutting rotating blades may be used. Shaping can be performed using dies which have the corresponding form and/or cutting of those. Also combinations of forming and cooling can be used, e.g. under water pelletizing.

Optionally further steps may be performed after cooling. Such steps are selected from the group consisting of milling, cutting, drying, mixing, dissolving, dispersing, calandering, laminating, shaping, pelletizing of the extrudate and any combination thereof.

The functionalized polyvinyl acetates obtained according to the method of the invention can be used as binder, cross-linker, functional coating (e.g. barrier layer), hardener, modifier, adhesive or combinations thereof.

The functionalized polyvinyl acetates obtained according to the method of the invention can be used for the production of a layered composition comprising the steps:
i) providing at least one functionalized partially hydrolyzed polyvinyl acetate obtained according to the method described above,
ii) dosing and mixing of the functionalized partially hydrolyzed polyvinyl acetate with further components to form a fluid mixture,
iii) superimposing the mixture on a substrate and
iv) optional further steps.

At least one functionalized polyvinyl acetate or mixtures of such polymers obtained according to the method of the invention is provided in step i), and in the following step ii) it is dosed and mixed with further ingredients to form a fluid mixture. Such methods can be dry mixing, stirring, dissolution, dispersing, emulgating, melting, extrusion and any combination thereof. This may be performed using any method known to the person skilled in the art. Preferably extrusion and dissolving or dispersing is used. The fluid mixture can be a melt, a solution, a suspension, an emulsion or any combination thereof. In some cases it may be advantageous to remove parts of the mixtures, e.g. by evaporation of solvent, to increase solids content or by filtration to remove unwanted particles.

In step iii) the fluid mixture is then superimposed on a substrate using methods known to the skilled person, e.g. by extrusion through a die, coating, lamination, calandering, spraying, evaporation, deposition and combinations thereof. Preferably the superimposing is performed by extrusion and/or coating. In some cases the solvents may be removed in order to form a film which is then laminated onto the substrate. There is no limitation with respect to the nature of the substrate, it can be three dimensional, film or sheet like, or in the form of fibers, rods or tubes or combinations thereof. The substrate may be a metal, a natural or artificial polymer, wood, paper, ceramic, stone or combinations thereof. Preferably the substrate is a metal or polymer film or sheet.

In an optional further step iv) selected from the group of drying, cooling, lamination, application of further layers, shaping, cutting and any combination thereof the layered composition may be adapted to its final use.

A method for the production of functionalized partially hydrolyzed polyvinyl acetate comprising vinyl alcohol, vinyl acetate and functionalized vinyl alcohol units by reacting in a melt a partially hydrolyzed polyvinyl acetate as component A, a reactive compound carrying at least one ethylenically unsaturated group and at least one reactive group reactive with hydroxyl or acetate groups as component B, in the presence of at least one stabilizer as component C and optionally in the presence of a catalyst as component D.

The present invention also concerns a method for the production of a layered composition comprising a functionalized partially hydrolyzed polyvinyl acetate comprising the steps:
 a) providing
  A) a partially hydrolyzed polyvinyl acetate as component A,
  B) a reactive compound carrying at least one ethylenically unsaturated group and at least one reactive group reactive with hydroxyl or acetate groups as component B,
  C) at least one stabilizer as component C, and
  D) optionally a catalyst as component D,
  and optionally drying one or more of components A, B, C and optionally D,
 b) optionally pre-mixing at least two of components A, B, C and optionally D,
 c) feeding the components into a mixing device capable of heating, melting and mixing components A, B, C and optionally D,
 d) heating, melting and mixing components A, B, C and optionally D in the device to give a melt and reacting components A in B in the melt,
 e) dosing and mixing of further components to form a fluid mixture,
 f) superimposing the mixture on a substrate and
 g) optional further steps.

In this method steps a) through d) correspond to steps a) trough d) of the method described above and the same methods and conditions as described above apply. In step e) further components are dosed and mixed with the functionalized partially hydrolyzed polyvinyl acetate obtained in the foregoing steps. Dosing and mixing of components A, B, C, and D is performed as described above and preferably one single extruder is used for all mixing and reaction steps. Feeding of solids and/or liquids may be performed at different locations and in different sequences.

The further components are selected from the group consisting of a further polymer, a filler, a plasticizer, an antiblocking agent, a monomer, an additive (e.g. a stabilizer, a dye), a stabilizer, a crosslinker, a binder, a color forming compound, a dye, a pigment, an antioxidant, an initiator, a photoinitiator and combinations thereof.

As further polymer and binder those which are either soluble, dispersible or emulsifiable in either aqueous solutions, organic solvents or combinations of both are used. Suitable polymeric binders are those conventionally used for the production of letterpress printing plates, such as completely or partially hydrolyzed polyvinyl esters, for example partially hydrolyzed polyvinyl acetates, polyvinyl alcohol derivatives, eg. partially hydrolyzed vinyl acetate/alkylene oxide graft copolymers, or polyvinyl alcohols subsequently acrylated by a polymer-analogous reaction, as described, for example, in EP-A 0079514, EP-A 0224164 or EP-A 0059988, and mixtures thereof. Also suitable as polymeric binders are polyurethanes or polyamides which are soluble in water or water/alcohol mixtures, as described, for example, in EP-A 00856472 or DE-A 1522444. These polymer binders account for in general from 20 to 98, preferably from 50 to 90% by weight of the total amount of the mixture.

As fillers organic as well as inorganic particles may be used. Organic fillers may be artificial or natural polymers, pigments, waxes, carbon, wood or combinations thereof. For example starch and derivatives, cellulose and derivatives, polyester, polyamide, polystyrene (PS), polymethyl methacrylate (PMMA), poly(ethylene)ketone, polyoxymethylene (POM), polytetrahydrofuran or poly(alpha-methylstyrene) may be used. Inorganic fillers may be metals, alloys, salts, glasses or combinations thereof. It is possible to use at least one or more selected from the group consisting of carbon black, feldspar, clay, silicon oxides, glass, quartz, silica, calcium carbonate, mica, talc, and a stearic acid metal salt, and it is particularly preferable to use silica and/or calcium carbonate. The fillers may be modified with reactable groups which may lead to crosslinking or formation of bonds with the other components, especially (meth)acrylated particles are preferred. It is advantageous if the filler is present in particulate form, in particular in spherical form or roughly spherical form, the particle size being in the range of about 0.1 to 20 µm, preferably 0.5 to 15 µm, more preferably 1 to 10 µm.

Monomers which are suitable for the preparation of the mixtures are those which are photopolymerizable and are compatible with the binders. Useful monomers of this type generally have a boiling point above 100° C. They usually have a molecular weight of less than 3000, preferably less than 2000.

Examples of suitable monomers are the esters of acrylic acid and/or methacrylic acid with monohydric or polyhydric alcohols, e.g. butyl acrylate, butyl methacrylate, 2-ethylhexyl acrylate, lauryl (meth)acrylate, ethylene glycol di(meth)acrylate, butane-1,4-diol di(meth)acrylate, neopentylglycol di(meth)acrylate, 3-methylpentanediol di(meth)acrylate, 2-hydroxypropyl (meth)acrylate, 2-hydroxyethyl (meth)acrylate, hexane-1,6-diol di(meth)acrylate, 1,1,1-trimethylolpropane tri(meth)acrylate, di-, tri- and tetraethylene glycol di(meth)acrylate, tripropylene glycol di(meth)acrylate, pentaerythritol tetra(meth)acrylate and 3,12-dihydroxy-1,5,10,14-tetraoxatetradec-1,14-diyl di(meth)acrylate. Other suitable compounds are the vinyl esters of aliphatic monocarboxylic acids, such as vinyl oleate; divinyl ethers of alcohols, such as octadecyl vinyl ether and butane-1,4-diol divinyl ether; the diesters of fumaric and maleic acid; and the reaction products of oligobutadienes having terminal OH groups with maleic acid and/or methacrylic acid. Alkenecarbonylamino-N-methylene ethers, such as ethylene glycolbis-, propanediolbis-, butanediolbis-, diethyleneglycolbis-, glycerolbis- or -tris- or pentaerythritoltetrakis-(methacrylamido-N-methylene) ether or the corresponding acrylamido-N-methylene ethers are also suitable. Among these monomers, 3,12-dihydroxy-1,5,10,14-tetraoxatetradec-1,14-diyl di(meth)acrylate and ethyleneglycolbis-, glycerolbis- and glyceroltris(methacrylamido-N-methylene) ether are particularly advantageous. Epoxy- and urethane(meth)acrylates, as obtained, for example, by reacting bisphenol A diglycidyl ether with (meth)acrylic acid or by reacting mono- or diisocyanates with hydroxyalkyl (meth)acrylates and, if required, with hydroxyl-containing polyesters or polyethers, are also suitable. Derivatives of acrylamide and of methacrylamide, for example ethers of their N-methylol derivatives with monohydric or polyhydric alcohols, e.g. ethylene glycol, glycerol, 1,1,1-trimethylolpropane or oligomeric or polymeric ethylene oxide derivatives, are also suitable. The monomers may be added to the mixture in a wide concentration range from 1 to 50 wt %, preferably in the range of 10 to 40 wt %, more preferably in the range of 15 to 35 wt %.

As initiators thermally or photochemically activatable compounds are used. Suitable thermal initiators are peroxides, hydroperoxides, azo or sulfur compounds, sulfur (elemental sulfur), sulfur chloride, sulfur dichloride, a mercapto compound, a sulfide compound, a disulfide compound, a polysulfide compound, a thiuram compound, a thiocarbamic acid compound, and a polyfunctional mercapto compound, a disulfide compound, a thiuram compound, a thiocarbamic acid compound, and a polyfunctional mercapto compound. Suitable copmpounds are e.g. dicumyl peroxide, α,α'-di(t-butylperoxy)diisopropylbenzene (and 2,5-dimethyl-2,5-di(t-butylperoxy)hexane, sulfur, sulfur chloride, sulfur dichloride, morpholine disulfide, alkylphenol disulfide, tetramethylthiuram disulfide, selenium dimethyldithiocarbamate, pentaerythritol tetrakis(3-mercaptobutyrate), pentaerythritol tetrakisthiopropionate, tris(3-mercaptobutyloxyethyl) isocyanurate, and dipentaerythritol hexakisthiopropionate, 1,1'-azobis(cyclohexanecarbonitrile) and Azobisisobutyronitrile.

Suitable photoinitiators or photoinitiator systems are those customary for radiation-sensitive recording materials, for example free radical photoinitiators, such as benzoin or benzoin derivatives, symmetrically or asymmetrically substituted benzil ketals, such as benzil dimethyl ketal or benzil 1-methyl 1-ethyl ketal, diarylphosphine oxides, such as 2,4,6-trimethylbenzoyldiphenylphosphine oxide or 2,6-dimethoxy-benzoyldiphenylphosphine oxide, ethyl 2,4,6-trimethyl-benzoylphenyl-phosphinate or acyldiarylphosphine oxides, diacylphosphine oxides or substituted and unsubstituted quinones, such as ethylanthraquinone, benzanthraquinone, benzophenone or 4,4'-bis(dimethylamino)benzophenone. Also suitable are triazines and hexaarylbisimidazoles.

They may be used alone or as a mixture with coinitiators, for example ethylanthraquinone with 4,4'-bis(dimethylamino)benzophenone or diacylphosphine oxides with tertiary amines or phosphines e.g. thriphenylphosphine. The photo-initiators are usually contained in the radiation-sensitive mixture in amounts from 0.1 to 10, preferably from 0.2 to 5% by weight, based on the sum of all components in the mixture.

As plasticizer one or a combination of the following compounds may be used polyethyleneglykol, glycerin, ethylene glykol, N-alkyl-benzolsulfonamide, phthalates and mixtures thereof, aliphthatic acidesters, e.g. dimethyl phthalate, diethyl phthalate, dibutyl phthalate, diisobutyl phthalate, dioctylphthalate, octylcapryl phthalate, dicyclohexyl phthalate, ditridecyl phthalate, butylbenzyl phthalate, diisodecyl phthalate, diallyl phthalate; glykolesters, e.g. dimethylglykol phthalate, ethylphthalylethylglykolate, methylphthalylethylglykolate, butylphthalylbutylglykolate or triethyleneglycoldicaprylic acidester; phosphoric acid esters e.g. tricresyl phosphate oder triphenyl phosphate; aliphatic diesters, e.g. diisobutyl adipate, dioctyladipate, dimethylsebacetate, dibutylsebacetate, dioctylazelate or dibutylmaleate; pentaerythritolpolyoxyethylene ether; polyglycidylmethacrylate; triethylcitrate; glycerintriacetylester and butyllaurate. The concentration of the plasticizer is in the range of 1 to 30 wt %, preferably 1 to 20 wt %, more preferably 1 to 15 wt % and most preferably 3 to 10 wt % of the mixture.

In addition further assistants and additives may be used, for example suitable dyes, pigments or photochromic additives in an amount of 0.0001-2% by weight. They serve for controlling the exposure properties, for identification, for direct monitoring of the exposure result or for esthetic purposes. A precondition for the choice is that they do not interfere with the photopolymerization of the mixtures. For example, the soluble phenazinium, phenoxazinium, acridinium and phenothiazinium dyes, such as Neutral Red (C.I. 50040), Safranine T (C.I. 50240), Rhodanil Blue, the salt or amide of Rhodamine D (Basic Violet 10, C.I. 45170), Methylene Blue B (C.I. 52015) or Solvent Black 3 (C.I. 26150), are suitable. These dyes can also be used together with a sufficient amount of a reducing agent which does not reduce the dye in the absence of actinic light but can reduce the dye in the excited electronic state on exposure. Examples of such mild reducing agents are ascorbic acid, anethole, thioureas or hydroxylamine derivatives, in particular salts of N-nitroso-cyclohexylhydroxylamine, preferably the potassium, calcium and aluminum salts. The addition of from 3 to 10 times the amount of dye has proven useful in many cases. As stabilizers and antioxidants compounds as described above may be added, their concentration being in the range of 0.01 to 5 wt %, preferably 0.1 to 3 wt %, more preferably 0.1 to 2 wt % based in the weight of the mixture.

In a preferred embodiment, the further components are dosed into the same mixing device, in particular the same extruder that is used in steps c) and d) above. I. e. steps c), d) and e) are carried out in the same mixing device.

In step f) the mixture is superimposed on a substrate using a method known to the skilled person, e.g. extrusion through a die, calandering, lamination and any combination thereof, on substrates as described above for step iii). Superimposing is preferably done by extrusion through a slit formed die or calandering the melt onto or between two substrates.

Examples of suitable dimensionally stable substrates are plates, sheets and conical and cylindrical sleeves of metals, such as steel, aluminum, copper or nickel, or of plastics, such as polyethylene terephthalate, polybutylene terephthalate, polyamide and polycarbonate, woven fabrics and non-wovens, such as glass fiber fabrics, and composite materials comprising glass fibers and plastics.

Particularly suitable dimensionally stable substrates are dimensionally stable substrate sheets and metal sheets, for example polyethylene or polyester sheets or steel or aluminum sheets. These substrate sheets are generally from 50 to 1100 µm, preferably from 75 to 400 µm, for example about 250 µm thick. These substrate sheets may be coated with a thin adhesion-promoting layer, for example a 1-5 µm thick layer, on that side of the substrate sheet which faces the mixture.

Between or during steps d), e) and f) a temperature change may be performed e.g. in order to adapt the viscosity or prevent degradation of a component. In most cases the temperature may be lowered but it may also be necessary to increase the temperature e.g. when compounds with a high melting or softening temperature are added.

In an optional further step g), which may be selected from the group consisting of drying, cooling, lamination, application of further layers, shaping, cutting and any combination thereof the layered composition may be adapted to its final use. Preferably in the optional step g) further layers, e.g. a cover sheet, a mask layer or a barrier layer, are applied e.g. by lamination or coating, the resulting layered composite is cut into the desired shape or mounted onto a flat or cylindrical carrier.

The layered compositions may be used as relief precursors or coated papers. The relief precursors may be processed further and used as flexographic printing plate, letter press plate, tampon press plate, direct (laser) engravable plate, gravure plate, intaglio plate, mater plate or microfluidic device.

Methods

Viscosity:

For the measurements 4 wt % solutions in distilled water were prepared. The measurements were performed in a falling ball viscometer according to DIN 53 015.

Degree of Hydrolysis

Degree of hydrolysis indicates percentage of vinyl acetate unit hydrolyzed to vinyl alcohol unit and it is calculated by following equation. EV standards for Ester Value which is the number of mg KOH needed to neutralize the acid released from the ester by hydrolysis in 1 g of substance and it is measured according to EN ISO 3681.

Degree of hydrolysis=100×(100−0.1535×EV)/(100−0.0749×EV)

Ester Value (EV)

Approximately 1 g starting partially hydrolyzed polyvinyl acetate is weighed into a 250 ml round-bottomed flask and mixed with 70 ml distilled water then heated with reflux until it dissolves. After cooling it is neutralized against phenolphthalein with 0.1 N potassium hydroxide. When neutralization is complete, 50 ml of 0.1 N potassium hydroxide are added and the mixture is boiled for 1 hour with reflux. The excess caustic solution is back-titrated in the heat with 0.1 N hydrochloric acid against phenolphthalein as indicator until the coloration fails to recur. A blank test is carried out at the same time.

Ester value=$a*b*5.61/E$ a=consumption of ml 0.1 N potassium hydroxide
b=consumption of ml 0.1 N potassium hydroxide in the blank test E=weighed quantity of starting partially hydrolyzed polyvinyl acetate I (dry)

Solubility-Test

Approximately 90 g of distilled water/n-propanol (w %, 75/25) mixture is weighed into a 250 ml round-bottomed flask and mixed with 10 g of the partially hydrolyzed polyvinyl acetate which was functionalized under stirring and heated afterwards to 80° C. for 4 hours. Afterwards a visual evaluation of the solution is performed, in detail about the clearance, turbidity, amount of particles, aggregation or clumping.

Degree of Functionalization

In the following the method is described for a partially hydrolyzed polyvinyl acetate which was functionalized with methacrylic acid (MAA). For other functionalization the method may be used accordingly. In a first step the samples to be measured are cleaned in order to remove residues of the reaction, especially monomer. Therefore about 12 g sample are extracted with 200 g acetone for 6 hours at 56° C. in a Soxhlet. Subsequently they are dried over 2 hours at 70° C. under vacuum (ca. 100 mbar). From the dried samples 10 wt % solutions are prepared using a 50 wt % n-propanol 50 wt % water mixture and the solids content is noted. 5 g of this solution and 2 g potassium hydroxide solution (aq. 2 mol/L) are weighted into a 50 mL vial. The samples are tempered for 4 hours at 93° C. After cooling to room temperature the solutions are neutralized by adding 3 g HCL (2 mol/L).

Subsequently the vials get closed and shaken for 45 minutes with a IKA 130 Basic Rüttler (IKA) at 450 U/min. Then 35 g Acetone containing decanol as internal standard (1500 g acetone/0.51 g 1-decanol) are added. The samples are mixed for 1.5 hours using an IKA 130 Basic Ruttier (IKA) at 450 U/min. This solution is sampled into 2 mL GC vials and filtered using a 0.25 µm syringe filter. The vials are placed in an auto sampler and analyzed with a TRACE 1300 GC with TriPlus 100LS gas chromatograph (Thermo Fisher Scientific) using the software Chromeleon (Version 7.2.). The values for the methacrylic acid (MAA) and acetic acid (AA) are given in mg/g. A FFAP column (Chromatographie Service GmbH) with a length of 50 m, a coverage of 0.25 mm at 220° C. and 175 kPa, a FID detector and hydrogen (6.0, Air Liquide) as carrier gas are used.

The analysis is done under the assumption that the molar amount of the methacrylic acid and of the acetic acid correspond to the molar amounts of the corresponding units (the vinyl acetate unit and the functionalized unit) in the polymer and that the molar portion of the vinyl alcohol units, the vinyl acetate units and the functionalized units add up to 100%. The values for methacrylic acid (mg/g) and acetic acid (mg/g) from the GC analysis are calculated using the total amount of the functionalized polymer (in g) whereby the masses of $m_{MAA}$ and $m_{AA}$ are obtained in g. The calculation is done according to:

$$n_{MAA} = \frac{m_{MAA}}{M_{MAA}} \text{ and } n_{AA} = \frac{m_{AA}}{M_{AA}} \text{ and therefore}$$

$$n_{vinyl\ alkohol} = \frac{(m_{funkt,PVA} - (n_{vinyl\ acetate} \times M_{vinyl\ acetate}) - (n_{vinyl\ methacrylate} \times M_{vinyl\ methacrylate})}{M_{vinyl\ alkohol}} \text{ with}$$

-continued $$M_{vinyl\ aetate} = 86\ \frac{g}{mol}$$

$$M_{vinyl\ methacrylate} = 112\ \frac{g}{mol}$$

$$M_{vinyl\ alkohol} = 44\ \frac{g}{mol}$$

the degree of functionalization in % is:

$$\text{degree of functionalization}[\%] = \frac{n_{vinyl\ methacrylate} \times 100}{n_{vinyl\ methacrylate} + n_{vinyl\ acetate} + n_{vinyl\ alkohol}}$$

EXAMPLES

Reactive extrusion experiments were carried out with a Leistritz ZSE 27 HP twin screw extruder with a screw diameter of 27 mm and a L/D ration of 44. The length of a zone was 4 D, thus the extruder has 11 zones. Feeding of the raw materials was performed in zone 1 and 2. Vacuum was applied in zone 10 to remove volatiles. The following temperature profile was used for all experiments: zone 1-3: 15° C./50° C./120° C., zone 4-11 190° C. A die temperature of 190° C. was set. The extruder screw profile was configured with conveying elements and kneading blocks in a way to homogeneously melt and mix all components with little shear according to common knowledge known to those skilled to the art. Solids were added to the extruder in zone 1, each with a separate gravimetric feeder. Liquids were added in zone 2, each with a separate feeding pump.

Strands with a diameter of 3 mm were extruded, which were cooled by a combination of water and air cooling. After cooling the strands were cut to pellets by a strand cutter.

For examples 1-8 KURARAY POVAL polymers were dried in a vacuum oven at 50° C. and 50 mbar for one day before they were subjected to extrusion.

Example 1 (Comparative)

KURARAY POVAL 5-74 with a degree of hydrolysis of 74 mol % was extruded with 5 wt % of methacrylic anhydride at a screw speed of 200 rpm and a throughput of 15 kg/h. The 10 wt % solution shows a good solubility and was clear. The degree of functionalization was determined to be 1.15 mol %.

Example 2 (Comparative)

KURARAY POVAL 5-74 was extruded with 5 wt % of methacrylic anhydride and 1 wt % N-methylimidazole at a screw speed of 200 rpm and a throughput of 15 kg/h. The 10 wt % solution shows a good solubility and was slightly turbid. The degree of functionalization was determined to be 1.61 mol %.

Example 3 (Comparative)

KURARAY POVAL 5-74 was extruded with 5 wt % of methacrylic anhydride and 2 wt % N-methylimidazole at a screw speed of 200 rpm and a throughput of 15 kg/h. The 10 wt % solution shows a good solubility and was slightly turbid. The degree of functionalization was determined to be 1.59 mol %.

Example 4

KURARAY POVAL 5-74 was extruded with 5 wt % of methacrylic anhydride and 1 wt % BHT at a screw speed of 200 rpm and a throughput of 15 kg/h. The 10 wt % solution shows a good solubility and was slightly turbid. The degree of functionalization was determined to be 0.81 mol %. Even though the degree of functionalization is somewhat lower than in example 1 without stabilizer it shows that in the presence of a stabilizer functionalization is possible on a comparable level.

Example 5

KURARAY POVAL 5-74 was extruded with 5 wt % of methacrylic anhydride, 2 wt % N-methylimidazole and 1 wt % BHT at a screw speed of 200 rpm and a throughput of 15 kg/h. The 10 wt % solution shows a good solubility and was slightly turbid. The degree of functionalization was determined to be 1.78 mol %.

From the results of examples 1 to 5 it is obvious that the addition of a stabilizer has a positive impact on the degree of functionalization also in the presence of a catalyst. In addition the reaction was achieved in a continuous, faster way requiring less process steps and without any additional plasticizer, solvent or unwanted impurity.

Example 6

KURARAY POVAL 4-88 with a degree of hydrolysis of 88 mol % was extruded with 5 wt % of methacrylic anhydride, 2 wt % N-methylimidazole and 1 wt % BHT at a screw speed of 200 rpm and a throughput of 15 kg/h. The degree of functionalization was determined to be 1.24 mol %.

Example 7

KURARAY POVAL 3-83 with a degree of hydrolysis of 83 mol % was extruded with 5 wt % of methacrylic anhydride, 2 wt % N-methylimidazole and 1 wt % BHT at a screw speed of 200 rpm and a throughput of 15 kg/h. The degree of functionalization was determined to be 1.79 mol %.

Example 8

KURARAY POVAL 8-88 with a degree of hydrolysis of 88 mol % was extruded with 5 wt % of methacrylic anhydride, 2 wt % N-methylimidazole and 1 wt % BHT at a screw speed of 200 rpm and a throughput of 15 kg/h. The degree of functionalization was determined to be 0.81 mol %.

Example 9

KURARAY POVAL 5-82 with a degree of hydrolysis of 82 mol % was first extruded with 1 wt % N-methylimidazole at a screw speed of 250 rpm and a throughput of 27 kg/h. Subsequently the resulting compound was extruded with a mixture of 7.5 wt % of methacrylic anhydride, and 2 wt % MEHQ at a screw speed of 200 rpm and a throughput of 15 kg/h. The degree of functionalization was determined to be 1.16 mol %.

Example 10

KURARAY POVAL 5-82 was blended with 1 wt % N-methylimidazole and 2 wt % BHT. Blending was performed by dissolving N-methylimidazole and BHT in ethanol and the solution was mixed with the polymer in a drum mixer and dried under reduced pressure in a vacuum oven at 50° C. The blend was then extruded with 7.5 wt % of methacrylic anhydride, at a screw speed of 200 rpm and a throughput of 15 kg/h. The degree of functionalization was determined to be 2.24 mol %.

Example 11

KURARAY POVAL 5-82 was first extruded with 1 wt % N-methylimidazole at a screw speed of 250 rpm and a throughput of 27 kg/h. Subsequently the resulting compound was extruded with a mixture of 6 wt % of methacrylic anhydride and 2 wt. % MEHQ at a screw speed of 200 rpm and a throughput of 15 kg/h. The degree of functionalization was determined to be 1.76 mol %.

Example 12

KURARAY POVAL 5-82 was blended with 1 wt % N-methylimidazole. Blending was performed by dissolving N-methylimidazole in ethanol and the solution was mixed with the polymer in a drum mixer and dried under reduced pressure in a vacuum oven at 50° C. The blend was extruded with a mixture of 13 wt. % of methacrylic anhydride, and 1.5 wt. % BHT at a screw speed of 200 rpm and a throughput of 15 kg/h. The degree of functionalization was determined to be 3.19 mol %.

Examples 6 to 12 show that polymers with other degrees of functionalization can be used in the process and that different sequences of mixing the components can have advantages.

Example 13

45 parts by weight of the functionalized polymer from example 8 were mixed with 20 parts of a polyvinyl alcohol-polyethylene glycol graft copolymer with a degree of hydrolysis of 97%, 33.18 parts phenylglycidyl ether acrylate, 1.5 parts 2,2-dimethoxy-1,2-diphenylethanone, 0.3 parts N-nitroso-cyclohexyl hydroxylamine potassium salt, 0.01 parts Safranin T (C.I. 50240), 0.01 parts Acriflavin (C.I. 46000) in 276 parts of water and 184 parts of n-propanol at 85° C. to form a homogeneous solution. The solution was coated onto a PET foil and dried at 60° C. in order to obtain a 600 μm thick layer. The resulting layer composition was exposed through a structured mask with actinic radiation and developed with water in order to form a printing plate.

Example 14

55 parts of the functionalized polymer from example 8 were mixed with 10 parts of a polyethylene glycol 400 polymer, 32.7 parts phenylglycidyl ether acrylate, 1.5 parts 2,2-dimethoxy-1,2-diphenylethanone, 0.3 parts N-nitroso-cyclohexyl hydromylamine potassium salt, in an extruder at temperatures between 160 and 190° C. The fluid mixture was applied onto a steel substrate using a slit die and cooled to room temperature resulting in a 600 mm thick layer. The resulting layer composition was exposed through a structured mask with actinic radiation and developed with water in order to form a printing plate.

Example 15

Example 8 was repeated (50 parts), however in an additional feeding section 15 parts of polyethylene glycol polymer, 33 parts phenylglycidylether acrylate, 1.5 parts 2,2-dimethoxy-1,2-diphenylethanone, 0.3 parts N-nitroso-cyclohexyl hydroxylamine potassium salt and 0.3 parts BHT were added and homogeneously mixed. The fluid mixture was applied onto a steel foil using a slit die and cooled to room temperature resulting in a 600 mm thick layer. The resulting layer composition was exposed through a structured mask with actinic radiation and developed with water in order to form a printing plate.

The invention claimed is:

1. A method for the production of functionalized partially hydrolyzed polyvinyl acetate comprising vinyl alcohol, vinyl acetate and functionalized vinyl alcohol units by reacting in a melt a partially hydrolyzed polyvinyl acetate as component A with a reactive compound carrying at least one ethylenically unsaturated group and at least one reactive group reactive with hydroxyl or acetate groups as component B, in the presence of at least one stabilizer as component C wherein the amount of stabilizer in the reaction mixture is in the range of from 0.01 to 5 wt %, and in the presence of at least one catalyst selected from the group consisting of tertiary amines and N containing heterocycles as component D, the method comprising the steps:
   a) optionally drying one or more of components A, B, C and optionally D,
   b) optionally pre-mixing two or more of components A, B, C and optionally D,
   c) feeding the components into a mixing device capable of heating, melting and mixing components A, B, C and optionally D,
   d) heating, melting and mixing components A, B, C and optionally D in the device to give a melt and reacting components A and B in the melt,
   e) optionally cooling or shaping and cooling the obtained mixture.

2. The method according to claim 1 wherein in component A the group reactive with hydroxyl or acetate groups is selected from the group consisting of an isocyanate group, an isothiocyanate group, an epoxy group, an aziridine group, a sulfonyl halide group, an acid halide group, a carboxylic anhydride group, a carboxylic acid group, a carboxylic ester group, an aldehyde group, a maleimide group, a N-hydroxysuccinimide ester group and any combination thereof.

3. A method for the production of functionalized partially hydrolyzed polyvinyl acetate comprising vinyl alcohol, vinyl acetate and functionalized vinyl alcohol units by reacting in a melt a partially hydrolyzed polyvinyl acetate as component A with a reactive compound carrying at least one ethylenically unsaturated group and at least one reactive group reactive with hydroxyl or acetate groups as component B, in the presence of at least one stabilizer as component C and
   in the presence of at least one catalyst selected from the group consisting of tertiary amines and N containing heterocycles as component D, the method comprising the steps:
   a) optionally drying one or more of components A, B, C and optionally D,
   b) optionally pre-mixing two or more of components A, B, C and optionally D,
   c) feeding the components into a mixing device capable of heating, melting and mixing components A, B, C and optionally D,
   d) heating, melting and mixing components A, B, C and optionally D in the device to give a melt and reacting components A and B in the melt, e) optionally cooling or shaping and cooling the obtained mixture, wherein the functionalized partially hydrolyzed polyvinyl acetate comprises as functionalized vinyl alcohol one or more units selected from the following units (Ia)-(Id):

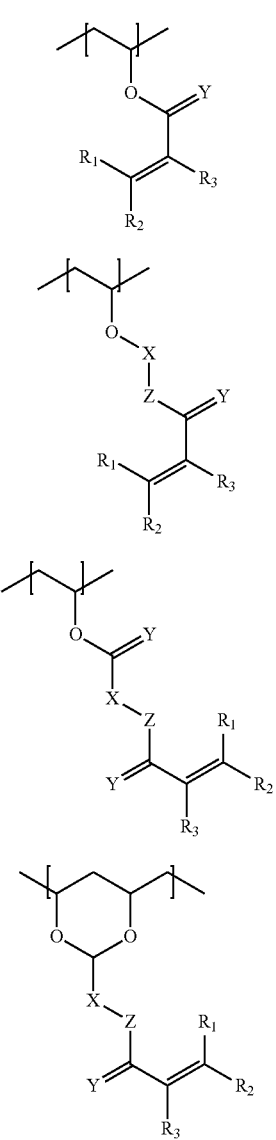

wherein $R_1$, $R_2$, $R_3$ are independently hydrogen, a linear or branched aliphatic or heteroaliphatic group with 1 to 12 carbon atoms or a cycloaliphatic, heterocyclic or aromatic group with 3 to 12 carbon atoms, and wherein X is a linear or branched or cyclic aliphatic or heteroaliphatic group having 1 to 12 carbon atoms or a cycloaliphatic, heterocyclic or aromatic group having 3 to 12 carbon atoms, Y is O or S and Z is N-R4, S or O with R4 being hydrogen, a linear or branched aliphatic or heteroaliphatic group having 1 to 12 carbon atoms or a cycloaliphatic, heterocyclic or aromatic group having 3 to 12 carbon atoms.

4. The method according to claim 1 wherein component B is (meth)acrylic acid or a (meth)acrylic acid derivative.

5. The method according to claim 4 wherein the (meth) acrylic acid derivative is a (meth)acrylic acid halogenide, a (meth)acrylic acid ester or a (meth)acrylic acid anhydride.

6. The method according to claim 1 wherein the mixing device is selected from the group consisting of a kneader, a co-kneader, a single screw extruder, a co-rotating twin-screw extruder, a counter-rotating twin-screw extruder and a multi screw extruder.

7. The method according to claim 1 wherein the feeding of the components is performed sequentially with the partially hydrolyzed polyvinyl acetate fed first.

8. The method according to claim 1 wherein the extruder has a length to diameter ratio in the range of from 20 to 150.

9. The method according to claim 1 wherein the feeding of the components is performed in different segments of an extruder.

10. The method according to claim 1 wherein the reaction temperature in step d) is from 100° C. to 270° C.

11. The method according to claim 1 wherein the cooling in step e) is performed by a cooling element, cooling rolls, a cooling belt, a liquid bath, a cooling medium flow, spraying cooling medium and/or gas cooling or combinations thereof.

12. The method according to claim 1 wherein before the cooling step a shaping step is carried out.

13. The method according to claim 1 wherein further steps carried out after step d) or e) are selected from the group consisting of milling, cutting, drying, mixing, dissolving, dispersing, shaping of the extrudate and any combination thereof.

14. The method according to claim 1 wherein the degree of hydrolysis of the partially hydrolyzed polyvinyl acetate is in the range of from 50 to 99 mol %.

15. The method according to claim 1 wherein the amount of stabilizer in the reaction mixture is in the range of from 0.5 to 5 wt %.

16. The method according to claim 1 wherein the amount of catalyst in the reaction mixture is in the range of from 0.01 to 5 wt %.

17. The method according to claim 1 wherein the degree of functionalization of the functionalized partially hydrolyzed polyvinyl acetates is in the range of from 0.5 to 20 mol %.

18. A method for the production of a layered composition comprising a functionalized partially hydrolyzed polyvinyl acetate comprising the steps:
  a) providing
    A) a partially hydrolyzed polyvinyl acetate as component A,
    B) a reactive compound carrying at least one ethylenically unsaturated group and at least one reactive group reactive with hydroxyl or acetate groups as component B,
    C) 0.01 to 5 wt, % of at least one stabilizer as component C, and
    D) at least one catalyst selected from the group consisting of tertiary amines and N containing heterocycles as component D,
    and optionally drying one or more of components A, B, C and optionally D,
  b) optionally pre-mixing at least two of components A, B, C and optionally D,
  c) feeding the components into a mixing device capable of heating, melting and mixing components A, B, C and optionally D, d) heating, melting and mixing components A, B, C and optionally D in the device to give a melt and reacting components A and B in the melt,
e) dosing and mixing of further components with the functionalized partially hydrolyzed polyvinyl acetate obtained in step d) to form a fluid mixture, and
f) superimposing the mixture on a substrate.

19. The method of claim 18, wherein steps c), d) and e) are carried out in the same mixing device.

20. The method of claim 18, wherein the mixing device is selected from the group comprising a kneader, a co-kneader, a single screw extruder, a co-rotating twin-screw extruder, counter-rotating twin-screw extruder and a multi screw extruder.

21. The method of claim 18, wherein the layered composition is a relief precursor or a coated paper.

* * * * *